United States Patent [19]
Morgante

[11] Patent Number: 5,424,574
[45] Date of Patent: Jun. 13, 1995

[54] LIGHT SHIELD FOR A BACK-SIDE THINNED CCD

[75] Inventor: Cristiano G. Morgante, Portland, Oreg.

[73] Assignee: Scientific Imaging Technologies, Inc., Beaverton, Oreg.

[21] Appl. No.: 196,656

[22] Filed: Feb. 14, 1994

Related U.S. Application Data

[63] Continuation of Ser. No. 948,549, Sep. 23, 1992, abandoned.

[51] Int. Cl.$^6$ ............... H01L 27/14; H01L 29/78
[52] U.S. Cl. ................... 257/435; 257/229; 257/294; 257/508; 257/908
[58] Field of Search ............ 257/222, 223, 228, 229, 257/235, 294, 436, 435, 445, 447, 908, 508

[56] References Cited

U.S. PATENT DOCUMENTS

| 3,864,722 | 2/1975 | Carnes | 257/228 |
| 4,040,092 | 8/1977 | Carnes | 257/228 |
| 4,176,369 | 11/1979 | Nelson et al. | 257/228 |
| 4,213,137 | 7/1980 | Pines | 257/228 |
| 4,313,127 | 1/1982 | Su et al. | 257/228 |
| 4,481,522 | 11/1984 | Jastrzebski et al. | 257/229 |
| 4,663,535 | 5/1987 | Nakai et al. | 257/231 |
| 4,760,031 | 7/1988 | Janesick | 257/228 |
| 4,774,557 | 9/1988 | Kosonocky | 257/228 |
| 4,916,543 | 4/1990 | Crosby | 348/215 |
| 4,941,029 | 7/1990 | Bluzer | 257/222 |
| 5,084,749 | 1/1992 | Losee et al. | 257/222 |
| 5,221,854 | 6/1993 | Banerjee et al. | 257/435 |

FOREIGN PATENT DOCUMENTS

| 62-55960 | 3/1987 | Japan | 257/229 |
| 2218162 | 8/1990 | Japan | 257/229 |

Primary Examiner—Mahshid D. Saadat
Attorney, Agent, or Firm—Smith-Hill and Bedell

[57] ABSTRACT

A light shield for a back-side thinned CCD has an aluminum reflective layer over the imaging surface of the CCD with a vanadium barrier layer between the aluminum reflective layer and the imaging surface. An optional oxide layer may be formed between the reflective and barrier layers.

18 Claims, 1 Drawing Sheet

LIGHT SHIELD FOR A BACK-SIDE THINNED CCD

CROSS REFERENCE TO RELATED APPLICATION

This is a continuation of application Ser. No. 07/948,549 filed Sep. 23, 1992, and now abandoned.

BACKGROUND OF THE INVENTION

The present invention relates to charge-coupled devices (CCDs), and more particularly to a light shield for a back-side thinned CCD that attenuates incident light at the surface of the CCD when the CCD is used as part of an opto-electric converter such as a streak tube.

In an opto-electric converter, such as a streak tube designed to digitize high bandwidth optical pulses, an optical signal is converted into an electron signal by directing the optical signal onto a photocathode which emits electrons. These electrons are accelerated toward and swept across the surface of an electron sensitive CCD. The photocathode is partially transmissive to the incident optical signal so that a fraction of the optical energy is passed through to the CCD. This spurious light signal generates in the CCD an undesired background signal.

What is desired is a light shield for the CCD that is opaque to the spurious light signal while being transmissive to the electron signal to eliminate the undesired background signal at the output of the CCD.

SUMMARY OF THE INVENTION

Accordingly the present invention provides a light shield for a back-side thinned CCD that is relatively opaque to light while being transmissive to electrons. A layer of reflective metal is placed on the imaging surface of the back-side thinned CCD. Between the layer of reflective metal and the imaging surface is a thin layer of refractory material having a relatively low density to pass electrons that is reflective to light.

The objects, advantages and other novel features of the present invention are apparent from the following detailed description when read in conjunction with the appended claims and attached drawing.

DESCRIPTION OF THE PREFERRED EMBODIMENT

Figure 1:
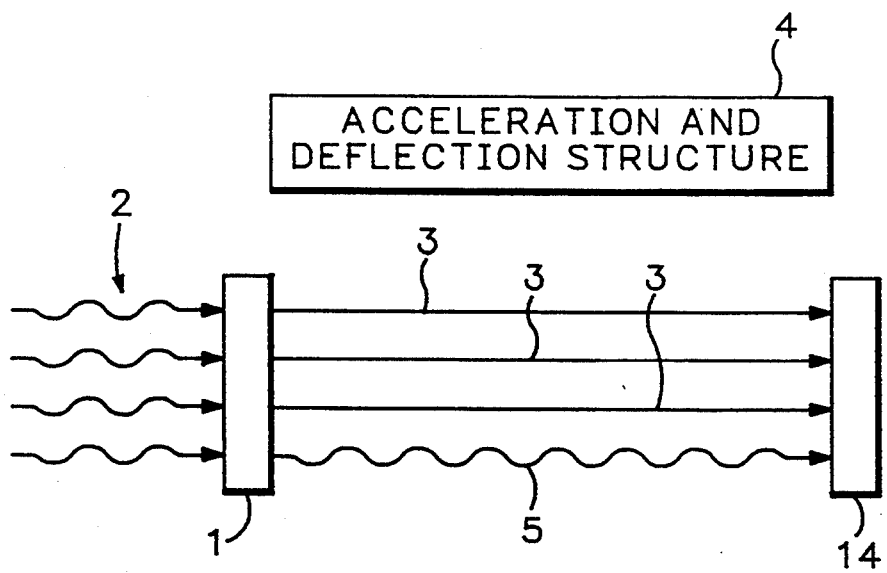
FIG. 1 is a schematic view of an opto-electric converter according to the present invention.

FIG. 1 illustrates schematically an opto-electric converter comprising a photocathode 1 upon which an optical signal 2 is incident. The photocathode 1 converts the optical signal 2 into an electron signal 3. An acceleration and deflection structure 4 accelerates the electrons toward the imaging surface of a back-side thinned electron sensitive CCD 14 and sweeps the electron signal across that surface. The photocathode 1 is partially transmissive to the incident optical signal 2 so that a portion 5 of the optical energy is passed through to the CCD 14.

Figure 2:
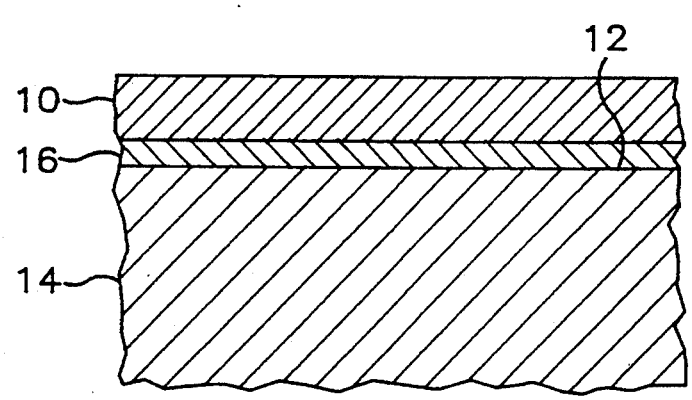
FIG. 2 is a cross-sectional view of a portion of a back-side thinned CCD having a light shield according to the present invention.

Referring now to FIG. 2 a layer 10 of a low density, reflective material, such as aluminum, is laid over the imaging surface 12 of the back-side thinned CCD 14. Although aluminum has very high reflectivity and low density, it is extremely reactive with silicon, the base material of the CCD 14, at modest temperatures for any length of time. The alloying reaction between silicon and aluminum causes pitting of the imaging surface 12, leading to unpredictable interactions with electrons impinging the imaging surface. Therefore a barrier layer 16 is laid between the reflective layer 10 and the imaging surface 12. The material of the barrier layer 16 is relatively unreactive with the material of the CCD 14 at normal processing temperatures, i.e., a refractory material, reflects light and has a low density to pass electrons. One such refractory material is vanadium which has a density of 6.11 gm/cc.

The vanadium barrier layer 16 is sputtered onto the imaging surface 12 of the CCD 14 with a thickness of approximately 200-300 angstroms. Then the aluminum reflective layer 10 is sputtered over the vanadium barrier layer 16 with a thickness of approximately 600 angstroms. Between the deposition of the vanadium barrier layer and the aluminum reflective layer, the vanadium barrier layer may be exposed to air to form an oxide interface between the two layers. The oxide interface may reduce the diffusion of the aluminum/vanadium system at the interface, further reducing non-uniformities that may be caused by such diffusion. At processing temperatures the vanadium barrier layer does react slightly with the aluminum reflective layer, but the vanadium does not readily react with the silicon imaging surface.

The thicknesses of the metal layers 10,16 are chosen such that there is enough material in the refractory layer to prevent the reflective layer from reacting with the substrate 14. The thicknesses described above are tailored to minimize the interdiffusion reaction between the reflective layer 10 and the substrate 14 while leaving the gain of the CCD as high as possible. However another decision is to tailor the gain of the CCD by increasing the thickness of the reflective layer 10 to further attenuate the electron beam that contacts the CCD imaging surface 12.

The density of the materials used for the reflective and barrier layers 10, 16 should be less than 10 gm/cc, and preferably less than 5 gm/cc. The number of elemental metals which simultaneously fit the criteria of high reflectivity and low density is limited. Both silver and aluminum are obvious choices since they are substantially more reflective than other metals and their reflectivity is fairly wavelength insensitive in the visible spectrum. Both metals react readily with silicon, but aluminum is less dense, 2.7 gm/cc as opposed to 10.5 gm/cc. Also aluminum forms a self passivating surface oxide whereas silver tends to corrode more readily. Finally aluminum has a strong absorption coefficient relative to other metals so it usually takes less aluminum to attenuate an equivalent fraction of light. Other reflective metals include chromium, copper, gold, palladium and rhodium, but none have the advantages of aluminum.

Refractory materials include titanium, but it was discovered that the aluminum/titanium system reacts with the silicon imaging surface appreciably. However other refractory materials that are nitrides or borides of aluminum, titanium, chromium, vanadium and zirconium have densities less than 10 gm/cc, with some having densities less than 5 gm/cc. These alloys have varying stoichiometric dependent conductivities and optical properties, and are often more refractory than vanadium. One of the main drawbacks with these alloys is that they tend to require more time to develop and make reproducible since the sputtering composition of both the target and the gas have to be controlled more precisely. The etch properties of these alloys also show a stoichiometric dependence.

Thus the present invention provides a light shield for a back-side thinned CCD by depositing a barrier layer of a low density, reflective refractory material between the imaging surface of the CCD and a subsequently deposited reflective layer of low density metal.

What is claimed is:

1. A light shield for an electron sensitive CCD that is back-side thinned and whose imaging surface is its back side, said light shield being transmissive to an electron beam signal and comprising:
   a first layer of a refractory, low density material on the imaging surface of the CCD, said first layer being transmissive to the electron beam signal; and
   a second layer of a reflective, low density metal on the first layer such that the first layer is between the imaging surface and the second layer, said second layer being transmissive to the electron beam signal,
   whereby the electron beam signal is transmitted to the imaging surface while light incident on the light shield is reflected and is inhibited from transmission to the imaging surface.

2. A light shield as recited in claim 1 wherein the material of the first layer is a metal and the light shield further comprises an oxide layer formed between the first and second layers, the oxide layer being an oxide of the first layer.

3. A light shield as recited in claim 1 wherein the first layer comprises a refractory material having a density less than 10 gm/cc.

4. A light shield as recited in claim 3 wherein the refractory material comprises vanadium.

5. A light shield as recited in claim 1 wherein the first layer comprises a refractory material having a density less than 5 gm/cc.

6. A light shield as recited in claim 1 wherein the second layer comprises a metal having a density less than 10 gm/cc.

7. A light shield as recited in claim 1 wherein the second layer comprises a metal having a density less than 5 gm/cc.

8. A light shield as recited in claim 7 wherein the metal comprises aluminum.

9. A light shield as recited in claim 1 wherein the refractory material comprises a material selected from the group consisting of the borides and nitrides of aluminum, titanium, chromium, vanadium and zirconium.

10. A light shield as recited in claim 1 wherein the refractory, low density material is reflective.

11. A light shield for an electron sensitive CCD having a substrate that is reactive with a selected metal that is reflective and of low density, said CCD being back-side thinned and the back side of the CCD being its imaging surface, said light shield being disposed over the imaging surface of the CCD and comprising:
   a reflective layer of said selected metal over the imaging surface of the CCD, the reflective layer being transmissive to the electron beam signal; and
   a barrier layer of a refractory, low density material between the imaging surface of the CCD and the reflective layer, said barrier layer being transmissive to the electron beam signal and comprising a material that is not reactive with the material of the CCD substrate,
   whereby the barrier layer prevents interaction between the reflective layer and the substrate and the electron beam signal is transmitted to the imaging surface while light incident on the light shield is inhibited from transmission to the imaging surface.

12. A light shield according to claim 11, wherein the material of the substrate of the CCD is silicon, the material of the reflective layer is aluminum, and the material of the barrier layer is selected from the group consisting of vanadium, the borides of aluminum, titanium, chromium, vanadium, and zirconium, and the nitrides of aluminum, titanium, chromium, vanadium, and zirconium.

13. A light shield according to claim 11, wherein the refractory, low density material is reflective.

14. A light shield according to claim 11, wherein the material of the barrier layer is a metal and the light shield further comprises a layer of an oxide of the material of the barrier layer between the barrier and reflective layers.

15. An opto-electric converter comprising:
   a photocathode for receiving an incident optical signal and generating an electron beam signal in response thereto,
   an electron sensitive CCD, said CCD being back-side thinned and the back side of the CCD being its imaging surface,
   a means for directing the electron beam signal toward the imaging surface of the CCD, and
   a light shield over the imaging surface of the CCD for transmitting the electron beam signal to the imaging surface while preventing light that passes from the photocathode toward the imaging surface from reaching the imaging surface, said light shield comprising a barrier layer of a refractory, low density material on the imaging surface of the CCD and a second layer of a reflective, low density metal on the barrier layer such that the barrier layer is between the imaging surface and the second layer, said second layer being transmissive to the electron beam signal.

16. An opto-electric converter according to claim 15, wherein the material of the substrate of the CCD is silicon, the material of the second layer is aluminum, and the material of the barrier layer is selected from the group consisting of vanadium, the borides of aluminum, titanium, chromium, vanadium, and zirconium, and the nitrides of aluminum, titanium, chromium, vanadium, and zirconium.

17. An opto-electric converter according to claim 15, wherein the refractory, low density material is reflective.

18. An opto-electric converter according to claim 15, wherein the material of the barrier layer is a metal and the light shield further comprises a layer of an oxide of the material of the barrier layer between the barrier layer and the second layer.

* * * * *